(12) United States Patent
Kato et al.

(10) Patent No.: US 10,128,345 B2
(45) Date of Patent: Nov. 13, 2018

(54) SEMICONDUCTOR DEVICE

(71) Applicant: FUJI ELECTRIC CO., LTD., Kanagawa (JP)

(72) Inventors: Ryoichi Kato, Matsumoto (JP); Hiromichi Gohara, Matsumoto (JP); Takafumi Yamada, Matsumoto (JP); Kohei Yamauchi, Matsumoto (JP); Tatsuhiko Asai, Hino (JP); Yoshitaka Nishimura, Azumino (JP); Akio Kitamura, Matsumoto (JP); Hajime Masubuchi, Shiojiri (JP); Souichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/792,772

(22) Filed: Oct. 25, 2017

(65) Prior Publication Data

US 2018/0166549 A1 Jun. 14, 2018

(30) Foreign Application Priority Data

Dec. 9, 2016 (JP) .................................. 2016-239144

(51) Int. Cl.

| H01L 29/423 | (2006.01) |
| H01L 23/492 | (2006.01) |
| H01L 23/367 | (2006.01) |
| H01L 23/28 | (2006.01) |
| H01L 29/739 | (2006.01) |
| H01L 23/00 | (2006.01) |

(52) U.S. Cl.
CPC ........ *H01L 29/42376* (2013.01); *H01L 23/28* (2013.01); *H01L 23/367* (2013.01); *H01L 24/73* (2013.01); *H01L 29/739* (2013.01); *H01L 2224/73263* (2013.01)

(58) Field of Classification Search
CPC ......... H01L 24/02; H01L 24/05; H01L 24/08; H01L 24/26; H01L 24/29; H01L 24/32; H01L 24/34; H01L 24/37; H01L 24/40; H01L 24/73; H01L 29/42376; H01L 2224/73263
See application file for complete search history.

(56) References Cited

FOREIGN PATENT DOCUMENTS

| JP | 2003115512 A | 4/2003 |
| JP | 2006210519 A | 8/2006 |

(Continued)

*Primary Examiner* — Robert Bachner
*Assistant Examiner* — Molly Reida

(57) ABSTRACT

A semiconductor device including a semiconductor element, an upper-surface electrode provided on an upper surface of the semiconductor element, a plated layer provided on an upper surface of the upper-surface electrode, one or more gate runners penetrating the plated layer and provided to extend in a predetermined direction on the upper surface of the semiconductor element, and a metal connecting plate that is arranged above the plated layer and is electrically connected to the upper-surface electrode, wherein the metal connecting plate has a joint portion parallel to the upper surface of the semiconductor element and has a rising portion that is connected to a first end of the joint portion and extends in a direction away from the upper surface of the semiconductor element, and in a plane parallel to the upper surface of the semiconductor element, the rising portion and the gate runner do not overlap with each other.

13 Claims, 12 Drawing Sheets

(56) References Cited

FOREIGN PATENT DOCUMENTS

| | | |
|---|---|---|
| JP | 2007035913 A | 2/2007 |
| JP | 2010287726 | 12/2010 |
| JP | 2013009014 A | 1/2013 |

SEMICONDUCTOR DEVICE

The contents of the following Japanese patent application are incorporated herein by reference:
NO. 2016-239144 filed in JP on Dec. 9, 2016.

BACKGROUND

1. Technical Field

The present invention relates to semiconductor devices.

2. Related Art

Conventionally, a structure in which a metal connecting plate such as a lead frame is connected to an upper-surface electrode of a semiconductor element has been known (see Patent Document 1, for example). The metal connecting plate has a plate-like joint portion connected to the upper-surface electrode and has a rising portion provided to extend upward from an end of the joint portion.

Patent Document 1: Japanese Patent Application Publication No. 2003-115512

The semiconductor element and the metal connecting plate are sealed with resin. If the temperature of the metal connecting plate varies, the rising portion of the metal connecting plate tries to expand and contract in the upward and downward direction. Because the upper side of the rising portion is pressed with sealing resin, the rising portion presses the upper-surface electrode of the semiconductor element. Consequently, strain caused in the region of the upper-surface electrode in the vicinity of the rising portion becomes larger than that in the other region of the upper-surface electrode.

The upper surface of the upper-surface electrode of the semiconductor element is plated with nickel or the like. The plated film is divided into a plurality of regions by a gate runner coated with an insulating film such as polyimide. Consequently, a boundary portion between the plated film and the gate runner serves as a triple junction where three members, namely, the upper-surface electrode such as aluminum, the plated film, and the gate runner are concentrated.

If a gap is generated in the boundary between the plated film and the gate runner due to contraction or the like of the insulating film of the gate runner, solder undesirably enters into the gap. If the strain becomes larger in the vicinity of the triple junction in this state, a crack is generated in the upper-surface electrode such as aluminum in some cases.

SUMMARY

A first aspect of the present invention provides a semiconductor device. The semiconductor device may include a semiconductor element, an upper-surface electrode, a plated layer, one or more gate runners, and a metal connecting plate. The upper-surface electrode may be provided on an upper surface of the semiconductor element. The plated layer may be provided on an upper surface of the upper-surface electrode. The one or more gate runners may penetrate the plated layer and be provided to extend in a predetermined direction on the upper surface of the semiconductor element. The metal connecting plate may be arranged above the plated layer. The metal connecting plate may be electrically connected to the upper-surface electrode. The metal connecting plate may have a joint portion and a rising portion. The joint portion may be parallel to the upper surface of the semiconductor element. The rising portion may be connected to a first end of the joint portion. The rising portion may extend in a direction away from the upper surface of the semiconductor element. In a plane parallel to the upper surface of the semiconductor element, the rising portion and the gate runner may not overlap with each other.

All of the one or more gate runners may extend in the predetermined direction.

At least one of the one or more gate runners may have a sensor wiring layer. The sensor wiring layer may be electrically separated from a gate conducting portion and the upper-surface electrode which are provided on the semiconductor element. The sensor wiring layer may be used to detect a state of the semiconductor element.

The semiconductor element may have a gate trench portion electrically connected to the one or more gate runners. In the plane parallel to the upper surface of the semiconductor element, the gate trench portion may extend in a direction orthogonal to the predetermined direction in which the one or more gate runners extend.

The gate trench portion may have a first extending portion and a second extending portion. The first extending portion and the second extending portion may extend in parallel to the direction orthogonal to the predetermined direction in which the one or more gate runners extend and extend by the same length in directions opposite to each other, with one of the one or more gate runners as a start point.

In the plane parallel to the upper surface of the upper-surface electrode, the semiconductor device may further include a guard ring provided outside the plated layer. In the plane parallel to the upper surface of the semiconductor element, a shortest distance between the guard ring and a side end of the joint portion may be 1 mm or longer.

The semiconductor device may further include a solder portion. The solder portion may be provided between the metal connecting plate and the plated layer. The solder portion may not contact the guard ring.

The joint portion may have a narrow portion. On the plane parallel to the upper surface of the semiconductor element, a width of the narrow portion may decrease gradually in a direction from a second end facing the first end toward the first end. The rising portion may be connected to the narrow portion at the first end of the joint portion. The width of the rising portion may be the same as a width of the narrow portion at the first end.

A curved portion having a radius of curvature of 1 mm or longer may be provided at a boundary portion between the rising portion and the joint portion.

In the plane parallel to the upper surface of the semiconductor element, a shortest distance between a second end opposite to the first end of the joint portion and the gate runner that does not overlap with the second end may be 1 mm or longer.

In the plane parallel to the upper surface of the semiconductor element, the plated layer may be divided into a plurality of compartments by the gate runner. The rising portion may be provided above a largest compartment of the compartments of the plated layer.

In the plane parallel to the upper surface of the semiconductor element, the rising portion may be arranged along a longitudinal direction of the semiconductor element.

The semiconductor device may further include a gate pad. The gate pad may be arranged on the upper surface of the semiconductor element. The gate pad may be provided outside a second end opposite to the first end of the joint portion.

The summary clause does not necessarily describe all necessary features of the embodiments of the present inven-

DESCRIPTION OF EXEMPLARY EMBODIMENTS

Hereinafter, (some) embodiment(s) of the present invention will be described. The embodiment(s) do(es) not limit the invention according to the claims. Also, all the combinations of the features described in the embodiment(s) are not necessarily essential to means provided by aspects of the invention.

Figure 1:
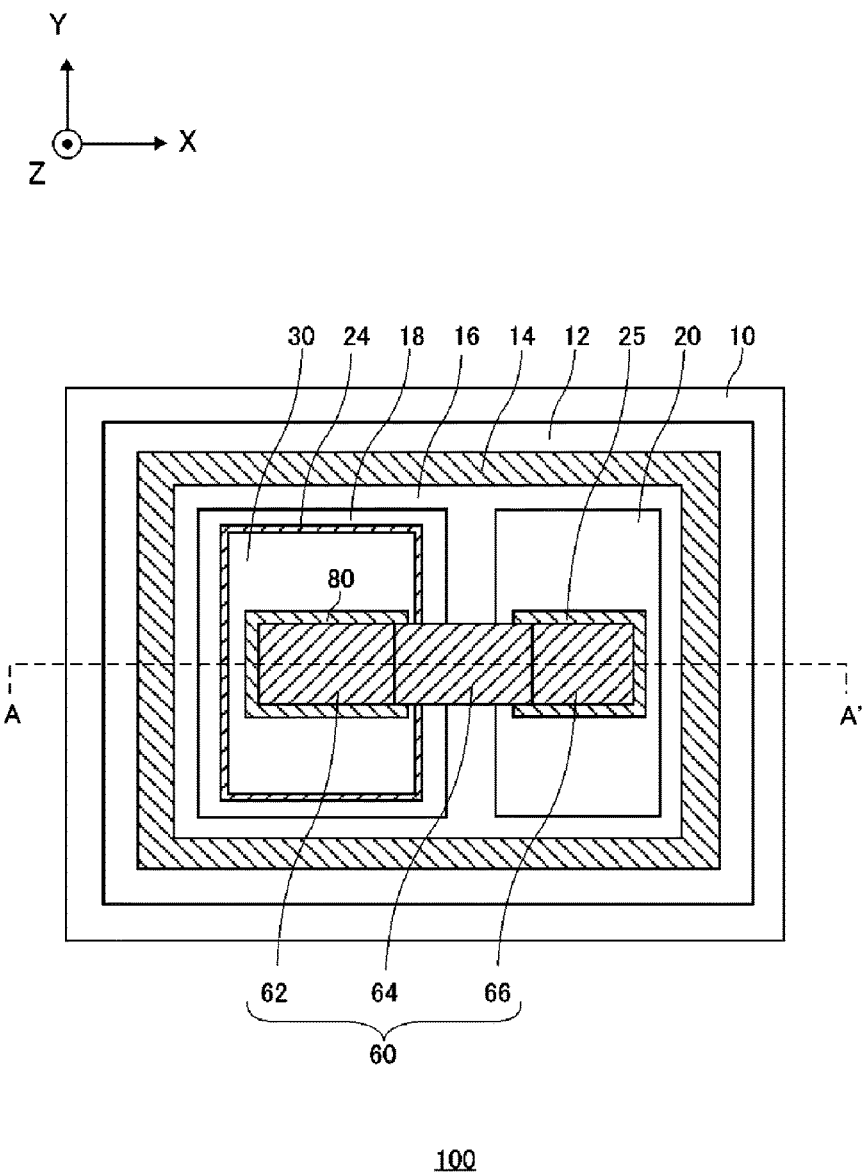
FIG. 1 is a diagram showing an upper surface of a semiconductor device 100 according to a first embodiment.
Figure 2:
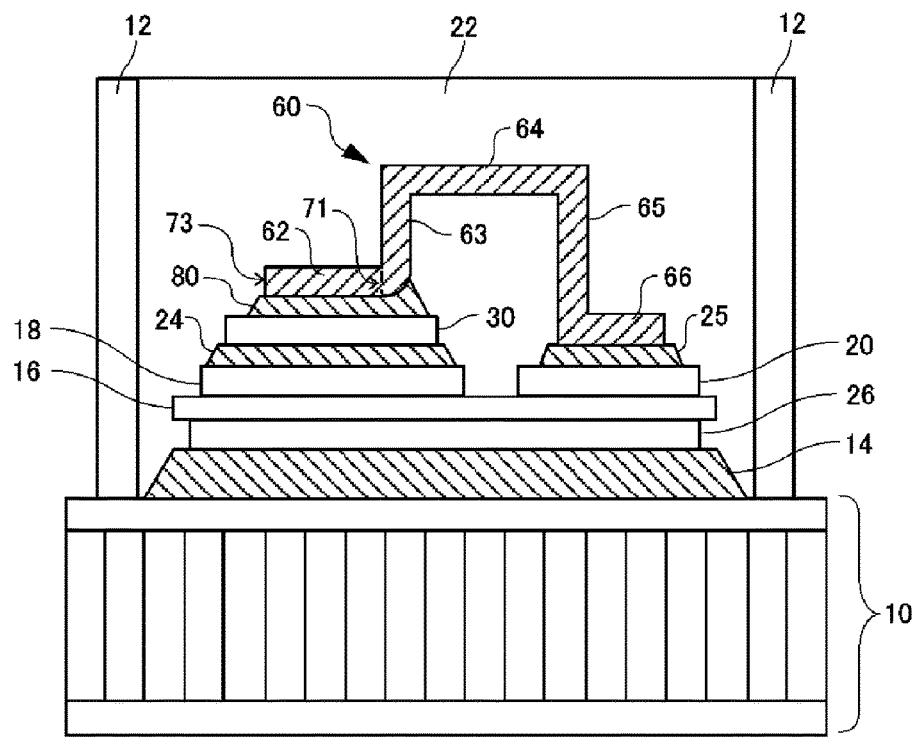
FIG. 2 is a diagram showing an A-A' cross-section in FIG. 1.

FIG. 1 is a diagram showing an upper surface of a semiconductor device 100 according to a first embodiment. FIG. 2 is a diagram showing an A-A' cross-section in FIG. 1. Hereinafter, one direction of the thickness directions of a semiconductor element 30, which will be described later, is referred to as an 'upward' direction, and the other direction is referred to as a 'downward' direction. Of two principal surfaces of an element, substrate, layer, film, or other members, one surface is referred to as an upper surface, and the other surface is referred to as a lower surface. The 'upward' and 'downward' directions are not limited to the gravity direction. In the present example, the upward and downward direction is referred to as the Z-axis direction, and two directions that are orthogonal to each other in a plane perpendicular to the Z-axis direction are referred to as the X-axis direction and the Y-axis direction.

The semiconductor device 100 of the present example includes a cooling portion 10, a case 12, a solder portion 14, a metal plate 26, an insulating substrate 16, a circuit portion 18, a circuit portion 20, a solder portion 24, a solder portion 25, a semiconductor element 30, a metal connecting plate 60, and a solder portion 80. The semiconductor element 30 is a semiconductor chip formed on a semiconductor substrate such as a silicon substrate. The semiconductor element 30 may include an insulated gate type bipolar transistor (IGBT), a power MOSFET, a free wheel diode (FWD), and the like. The semiconductor element 30 may also include an RC-IGBT (reverse-conducting IGBT) in which a IGBT and a FWD are provided on one chip. On the upper surface of the semiconductor element 30, an upper-surface electrode such as an emitter electrode, a source electrode, and an anode electrode is provided.

The cooling portion 10 releases heat generated by the semiconductor element 30 or the like to the outside. The cooling portion 10 is formed of material with a high thermal conductivity such as aluminum. The cooling portion 10 may have a plurality of fins in order to increase a heat releasing area.

On an upper surface of the cooling portion 10, a laminated substrate is provided. The laminated substrate of the present example is a DCB (direct copper bonding) substrate or an AMB (active metal brazing) substrate, each of which includes the metal plate 26, the insulating substrate 16, and the circuit portion 18 and the circuit portion 20 in this order.

The insulating substrate 16 is formed of insulating material such as ceramics. The metal plate 26 is provided on the lower surface of the insulating substrate 16. The circuit portion 18 and the circuit portion 20 are provided on the upper surface of the insulating substrate 16. The solder portion 14 thermally and mechanically fixes the metal plate 26 and the cooling portion 10. The solder portion 14 is preferably solder of a high strength such as Sn—Sb based or Sn—Sb—Ag based solder.

The circuit portion 18 and the circuit portion 20 are electrically connected to the semiconductor element 30, and receive and transfer power, electrical signals, and the like between the semiconductor element 30 and these portions. The circuit portion 18 and the circuit portion 20 may include metal wiring, a pad, and the like provided on the upper surface of the insulating substrate 16 or may include a signal processing circuit and the like.

The semiconductor element 30 is provided on the upper surface of the circuit portion 18. The semiconductor element 30 is fixed to the circuit portion 18 by the solder portion 24. The solder portion 24 electrically and mechanically connects the semiconductor element 30 and the circuit portion 18. For example, the solder portion 24 connects a pad and the like included in the circuit portion 18 and a terminal of the semiconductor element 30. The solder portion 24 is, for example, Sn—Cu based or Sn—Sb based solder. Also, the semiconductor element 30 is electrically connected to the circuit portion 20 via the metal connecting plate 60. One end of the metal connecting plate 60 is connected to the upper surface of the semiconductor element 30, and the other end of the metal connecting plate 60 is connected to the upper surface of the circuit portion 20.

The metal connecting plate 60 is formed of copper, copper alloy, aluminum, aluminum alloy, or the like, as an example. The thickness of the metal connecting plate 60 is 0.5 mm or thicker and 1 mm or thinner, as an example. The metal connecting plate 60 has a joint portion 62 connected to the upper surface of the semiconductor element 30, a joint portion 66 connected to the upper surface of the circuit portion 20, and a connection portion 64 that connects the two joint portions, namely, the joint portion 62 and the joint portion 66. The joint portion 62 may be arranged in parallel to the upper surface of the semiconductor element 30. The joint portion 62 has a first end 71 that is relatively close to the connection portion 64, and a second end 73 that is relatively far from the connection portion 64. The joint portion 66 may be arranged in parallel to the upper surface of the circuit portion 20.

The joint portion 62 is fixed to the semiconductor element 30 by the solder portion 80. The joint portion 66 is fixed to the circuit portion 20 by the solder portion 25. The solder portion 80 and the solder portion 25 are, for example, Sn—Cu based or Sn—Sb based solder.

A rising portion 63 is provided between the joint portion 62 and the connection portion 64. Also, a rising portion 65 is provided between the joint portion 66 and the connection portion 64. The rising portion 63 is connected to the first end 71 of the joint portion 62 and extends in a direction away from the upper surface of the semiconductor element 30. The rising portion 65 is connected to an end of the joint portion 66, the end being close to the connection portion 64, and extends in a direction away from the upper surface of the circuit portion 20. The rising portion 63 and the rising portion 65 of the present example extend in a direction perpendicular to the upper surface of the semiconductor element 30 and the upper surface of the circuit portion 20 (that is, the Z-axis direction).

On the upper surface of the cooling portion 10, the case 12 is provided to surround the laminated substrate, the semiconductor element 30, the metal connecting plate 60, and the respective solder portions. The case 12 of the present example has a frame shape. The case 12 may be formed of conductive material such as metal or the like or may be formed of insulating material such as resin. The inside of the case 12 is sealed with sealing resin 22. That is, the laminated substrate, the semiconductor element 30, the metal connecting plate 60, and the respective solder portions are entirely covered with the sealing resin 22.

Figure 3:
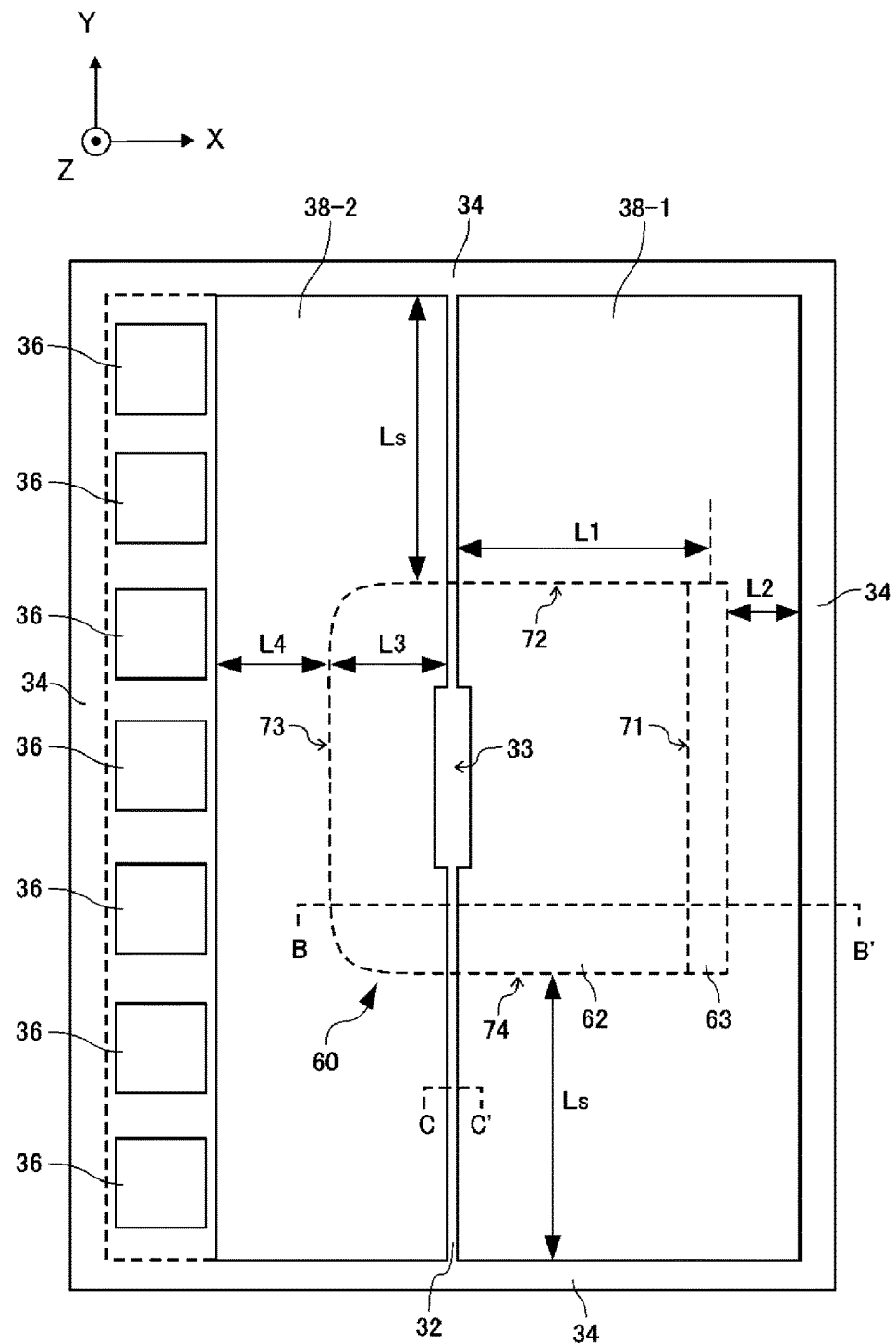
FIG. 3 is a diagram showing an exemplary upper surface of a semiconductor element 30.
Figure 4:
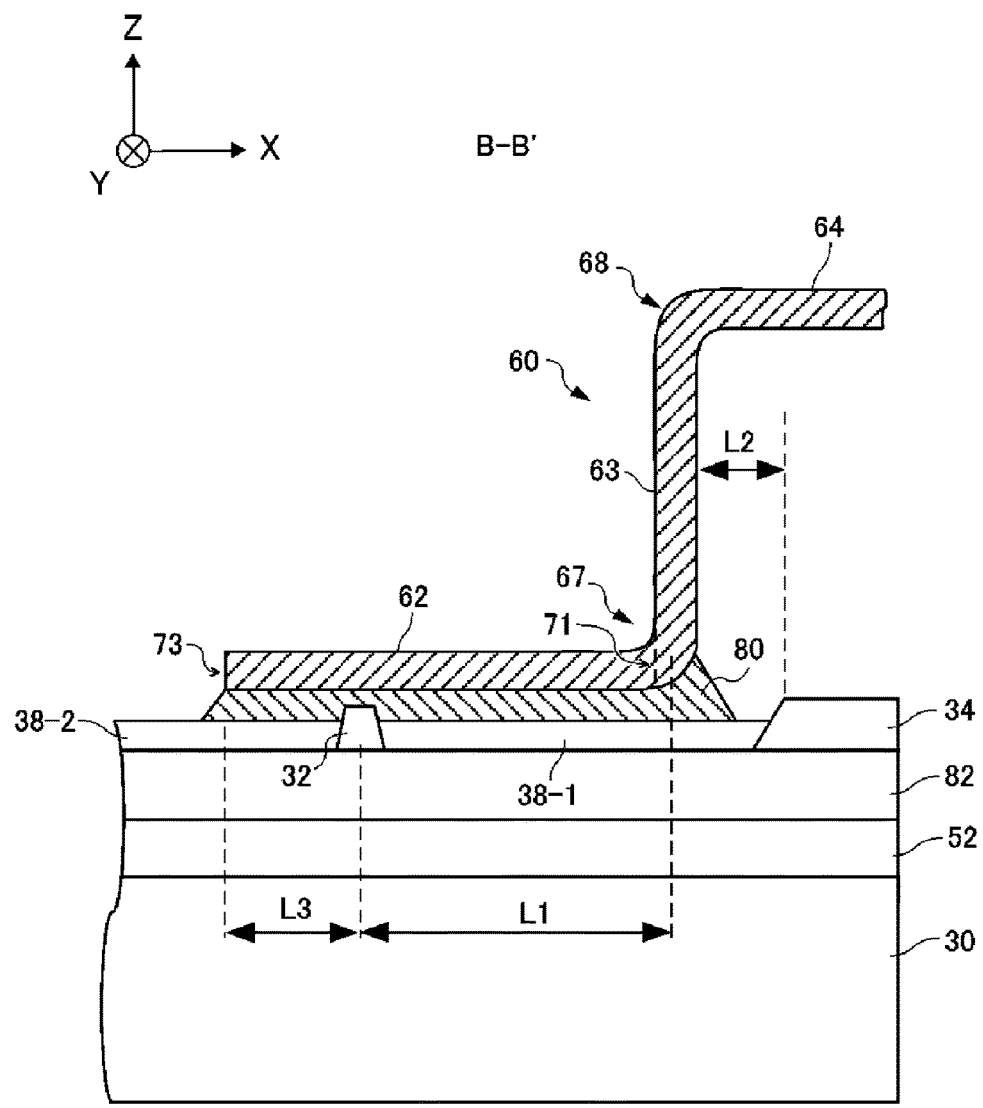
FIG. 4 is a diagram showing a B-B' cross-section in FIG. 3.

FIG. 3 is a diagram showing an exemplary upper surface of the semiconductor element 30. FIG. 4 is a diagram showing a B-B' cross-section in FIG. 3. In FIG. 3, broken lines show positions where the joint portion 62 and the rising portion 63 of the metal connecting plate 60 are provided. As shown in FIG. 4, on the upper surface of the semiconductor element 30, a first insulating film 52, an upper-surface electrode 82, a plated layer 38, one or more gate runners 32, and a guard ring 34 are provided. Note that FIG. 4 omits illustration of the gate runner 32.

The upper-surface electrode 82 is provided in a predetermined region above the upper substrate surface of the semiconductor element 30. On the upper surface of the semiconductor element 30, one or more pads 36 may be provided in a region separate from the upper-surface electrode 82. The upper-surface electrode 82 is, for example, an emitter electrode, a source electrode, or an anode electrode. A pad 36 is, for example, a gate electrode, a temperature-detecting electrode, a current detecting electrode, or the like.

The plated layer 38 is provided on the upper surface of the upper-surface electrode 82. The plated layer 38 contains, for example, Ni, Ni/Au, Sn, or the like. The plated layer 38 may be provided on the entire upper surface of the upper-surface electrode 82. The gate runner 32 penetrates the plated layer 38 in the Z-axis direction. That is, the lower end of the gate runner 32 contacts the upper-surface electrode 82, and the upper end of the gate runner 32 protrudes from the plated layer 38.

The gate runner 32 has a conducting portion formed of material such as polysilicon that is doped with impurities, and has an insulating portion formed of polyimide or the like that coats the conducting portion. The insulating portion insulates the conducting portion from the plated layer 38, the upper-surface electrode 82, and the solder portion 80. The gate runner 32 is provided to extend on the upper surface of the semiconductor element 30 in a predetermined direction. For example, the gate runner 32 is provided to be linear on the XY plane. The conducting portion of the gate runner 32 is electrically connected to the pad 36 and a control electrode of a transistor or the like provided in the semiconductor element 30.

In the example of FIG. 3, one gate runner 32 is provided. The gate runner 32 is provided from an end to the other end of the plated layer 38 in the Y-axis direction. The plated layer 38 is thereby divided into two compartments. Note that the gate runner 32 of the present example has a sense region 33 in the center thereof in the longitudinal direction. The sense region 33 may have a width wider than a width of the gate runner 32. Note that the width of the gate runner 32 in the present example means a length in the direction orthogonal to the longitudinal direction of the gate runner 32. The sense region 33 may have a joint portion of an anode semiconductor region and a cathode semiconductor region which are each electrically connected to a sensor wiring layer to be described later. Note that in another example, the semiconductor element 30 may not include the sense region 33. In this case, a fewer number of the pads 36 than in the example shown in FIG. 3 may be provided.

On the upper surface of the upper-surface electrode 82, the guard ring 34 is provided outside the plated layer 38. The term 'outside' indicates a position closer to an end of the upper surface of the semiconductor element 30. On the upper surface of the upper-surface electrode 82, the guard ring 34 of the present example is provided to surround the entire plated layer 38. The guard ring 34 may be provided along the periphery of the upper-surface electrode 82.

The metal connecting plate 60 is arranged above the plated layer 38 and is electrically connected to the upper-surface electrode 82 via the solder portion 80 and the plated layer 38. The joint portion 62 and the rising portion 63 of the metal connecting plate 60 are arranged in a region where the upper-surface electrode 82 and the plated layer 38 are provided. That is, the joint portion 62 and the rising portion 63 are arranged on the inner side relative to the guard ring 34.

Above the upper surface of the semiconductor element 30, the rising portion 63 of the metal connecting plate 60 has a linear shape extending in a predetermined direction. The rising portion 63 of the example of FIG. 3 extends in the Y-axis direction and is arranged in parallel to the gate runner 32.

As described above, the metal connecting plate 60 is sealed with the sealing resin 22. Consequently, the upper side of the rising portion 63 is pressed by the sealing resin 22 if the rising portion 63 tries to expand and contract in the upward and downward direction in response to a temperature change. The rising portion 63 thus presses or pulls the solder portion 80, the plated layer 38, and the upper-surface electrode 82.

On the other hand, a triple junction where the insulating portion of the gate runner 32, the plated layer 38, and the upper-surface electrode 82 are concentrated is present on the upper surface of the upper-surface electrode 82. At the triple junction, a gap is prone to be generated due to factors such as thermal contraction of the insulating portion of the gate runner 32, and solder is prone to enter into the gap. If a large strain is generated at the triple junction due to pressing or the like by the rising portion 63, a crack is generated in the upper-surface electrode 82 formed of aluminum or the like in some cases.

Consequently, the triple junction is preferably not present directly beneath the rising portion 63 where a large strain is prone to be generated. In the present example, in the plane parallel to the upper surface of the semiconductor element 30, a first distance L1, which is the shortest distance between the gate runner 32 and the rising portion 63, is 1 mm or longer. In the present example, the shortest distance between the rising portion 63 and the gate runner 32 that is closest to the rising portion 63 and of the plurality of gate runners 32 along the Y-axis direction is 1 mm or longer.

By making the first distance L1 1 mm or longer, strain can be reduced at the triple junction even if a temperature change is generated. Consequently, generation of cracks in the upper-surface electrode 82 is suppressed, and the lifetime of the semiconductor device 100 can be prolonged. The first distance L1 may be 1.2 mm or longer or may be 1.5 mm or longer. In the present example, the reference positions of the rising portion 63 and the gate runner 32 in the first distance L1 are respectively their central positions in the X-axis direction.

Also, in the plane parallel to the upper surface of the semiconductor element 30, the rising portion 63 of the present example does not overlap with the gate runner 32. In the present example, the rising portion 63 and the gate runner 32 do not overlap with each other at all in the height direction of the semiconductor device 100 (the Z direction in the present example). Hence, in the present example, generation of cracks in the upper-surface electrode 82 can be suppressed more than in a case where the rising portion 63 and the gate runner 32 at least partially overlap with each other and in a case where they completely overlap with each other. This can prolong the lifetime of the semiconductor device 100.

Also, the triple junction is present at the boundary between the guard ring 34 and the plated layer 38. Consequently, in the plane parallel to the upper surface of the semiconductor element 30, the distance between the rising portion 63 and the guard ring 34 is preferably elongated. The distance between the rising portion 63 and the guard ring 34 is preferably long to the extent that the solder portion 80 does not contact the guard ring 34. This suppresses entry of solder into the gap at the triple junction, which can prolong the lifetime of the semiconductor device 100. In the present example, a second distance L2, which is the shortest distance between the rising portion 63 and the guard ring 34, is 1 mm or longer. In the present example, reference positions of the rising portion 63 and the guard ring 34 in the second distance L2 are end positions facing each other in the X-axis direction.

Similarly, in order to suppress entry of the solder portion 80 into the triple junction, in the plane parallel to the upper surface of the semiconductor element 30, it is preferable to elongate also the distance between the guard ring 34 and a first side end 72 of the joint portion 62 and the distance between the guard ring 34 and a second side end 74 of the joint portion 62, the side ends being located between the first end 71 and the second end 73. In the present example, a shortest distance $L_S$ between the guard ring 34 and the first side end 72 of the joint portion 62 and a shortest distance $L_S$ between the guard ring 34 and the second side end 74 of the joint portion 62 are each 1 mm or longer. This can prevent the solder portion 80 from entering into the boundary between the guard ring 34 and the plated layer 38 also in the Y-axis direction.

The rising portion 63 of the present example is arranged between the guard ring 34 and the gate runner 32. In this case, the first distance L1 between the rising portion 63 and the gate runner 32 may be made longer than the second distance L2 between the rising portion 63 and the guard ring 34. Because the solder portion 80 is provided on the gate runner 32, solder is prone to enter between the gate runner 32 and the plated layer 38. By making the first distance L1 longer than the second distance L2, the rising portion 63 and the gate runner 32 can be further spaced away from each other. The strain at the triple junction of the gate runner 32 is thereby reduced, and the lifetime of the semiconductor device 100 can be further prolonged. The first distance L1 may be equal to or longer than 1.5 times or equal to or longer than twice the second distance L2.

Note that the distance between the gate runner 32 and the guard ring 34 in the X-axis direction may be X mm, and the upper limit of the first distance L1 may be X−1 mm. That is, the first distance L1 may be maximized, with the second distance L2 secured to be long to the extent that the solder portion 80 does not reach the guard ring 34.

The plated layer 38 is divided into a plurality of compartments by the gate runner 32. In the present example, on the plane parallel to the upper surface of the semiconductor element 30, the plated layer 38 is divided into compartments, a plated layer 38-1 and a plated layer 38-2. The area of the compartment of the plated layer 38-1 in the plane parallel to the upper surface of the semiconductor element 30 is larger than any other compartment. Also, the length of the compartment of the plated layer 38-1 is longer than the length of the other compartments in a direction (the X-axis direction in the present example) orthogonal to the direction in which the rising portion 63 extends above the upper surface of the semiconductor element 30.

The rising portion 63 of the present example is provided above the compartment of the plated layer 38-1 that is largest of the compartments of the plated layer 38. Also, the joint portion 62 is provided across all of the compartments of the plated layer 38. The metal connecting plate 60 can thereby be easily arranged provided that the rising portion 63 and the gate runner 32 do not overlap with each other.

Note that the pads 36 are preferably provided outside the second end 73 opposite to the first end 71 of the joint portion 62. This can suppress interference of the wire and the like with the metal connecting plate 60, the wire and the like being connected to the pads 36. Also, the upper surface of the semiconductor element 30 of the present example is rectangular. In the plane parallel to the upper surface of the semiconductor element 30, the rising portion 63 is arranged along the longitudinal direction (Y-axis direction) of the upper surface of the semiconductor element 30. The range to which the rising portion 63 applies stress is thereby expanded, which can suppress local application of a large stress.

Also, a curved portion 67 is preferably provided at the boundary portion between the rising portion 63 and the joint portion 62 of the metal connecting plate 60. The curved portion 67 is formed intentionally to have a curved surface, and the radius of curvature is, for example, 1 mm or longer. The radius of curvature of the curved portion 67 may be 1.5 mm or longer or may be 2.0 mm or longer.

Also, a curved portion 68 may be provided at the boundary portion between the rising portion 63 and the connection portion 64. The curved portion 68 may have a curved surface that is formed not intentionally. The radius of curvature of the curved portion 67 may be greater than the radius of curvature of the curved portion 68.

Providing the curved portion 67 at the boundary portion between the rising portion 63 and the joint portion 62 allows the solder portion 80 to more easily go upward along the curved portion 67 in a case where the solder portion 80 provided between the joint portion 62 and the plated layer 38 is heated for reflow or the like. This can prevent the solder portion 80 from laterally expanding and reaching the guard ring 34.

In this way, with the curved portion 67 provided, the solder portion 80 can hardly reach the guard ring 34 even if the distance between the rising portion 63 and the guard ring 34 is made short. The semiconductor element 30 can thus be miniaturized. Alternatively, the distance between the gate runner 32 and the rising portion 63 can be easily secured.

In the plane parallel to the upper surface of the semiconductor element 30, a third distance L3, which is the shortest distance between the second end 73 opposite to the first end 71 of the joint portion 62 and the gate runner 32 not overlapping with the second end 73, may also be 1 mm or longer. Strain becomes larger at the end of the joint portion 62 than at the central portion of the joint portion 62 in some cases. Consequently, the third distance L3 is preferably 1 mm or longer. However, because strain at the second end 73 of the joint portion 62 is smaller than the strain in the vicinity of the rising portion 63, the third distance L3 may be shorter than the first distance L1.

In the plane parallel to the upper surface of the semiconductor element 30, a fourth distance L4, which is the shortest distance between the second end 73 of the joint portion 62 and the guard ring 34, may also be 1 mm or longer. This can suppress reaching of solder portion 80 to the guard ring 34 also in the vicinity of the second end 73. Note that the first distance L1 may be longer than any of the second distance L2, the third distance L3, and the fourth distance L4.

Figure 5:
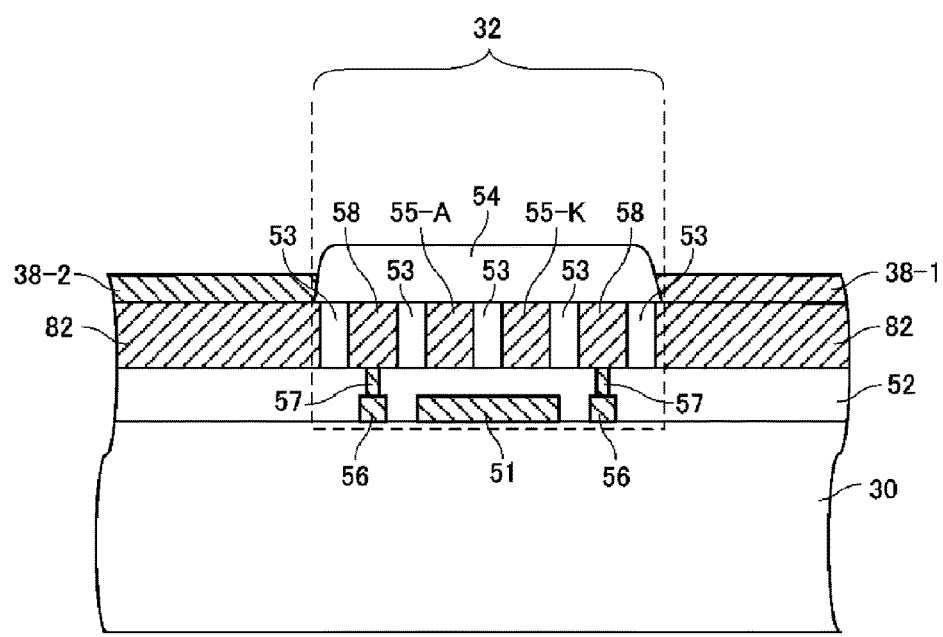
FIG. 5 is a diagram showing a C-C' cross-section in FIG. 3.

FIG. 5 is a diagram showing a C-C' cross-section in FIG. 3. FIG. 5 mainly illustrates the configuration of the gate runner 32. The C-C' cross-section is a cross-section across the gate runner 32 and in parallel to the XZ plane. The gate runner 32 of the present example has a layered structure of first to third layers.

The first layer has a gate conducting portion 51, first wiring layers 56, plugs 57, and a first insulating film 52. The gate conducting portion 51 and the first wiring layers 56 may be provided on the semiconductor element 30 and provided to extend in parallel to the Y-axis direction in the gate runner 32. In the present example, the gate conducting portion 51 and the first wiring layers 56 extend from one end to the other end of the gate runner 32 in the Y-axis direction. The gate conducting portion 51 may be electrically connected to the pad 36 for the gate. To gate trenches provided in the semiconductor element 30, the gate conducting portion 51 may transmit a gate potential that is input from a control terminal to one of the pads 36. In contrast, the first wiring layer 56 may transmit an emitter potential to a dummy trench portion that is electrically connected to the emitter electrode of the semiconductor element 30.

The gate conducting portion 51 and the first wiring layer 56 may be formed of polysilicon. Because the gate conducting portion 51 and the first wiring layers 56 of the present example are simultaneously formed by etching a polysilicon layer, they are wiring having the same height in the Z direction. Via the plugs 57 provided intermittently in the Y-axis direction, the first wiring layers 56 may be electrically connected to second wiring layers 58 in the second layer having the emitter potential. The plug 57 is a plug formed of tungsten, for example.

The first insulating film 52 electrically separates the gate conducting portion 51 from the first wiring layers 56, and the plugs 57. The first insulating film 52 may be a laminated film of a HTO film (high temperature oxide film) and a BPSG film (boro-phospho silicate glass film). Also, the first insulating film 52 electrically separates the gate conducting portion 51 from a sensor wiring layer 55 and the like in the second layer. However, the first wiring layers 56 and the plugs 57 penetrate the first insulating film 52 and are electrically connected to the second wiring layers 58 provided in the second layer.

The second layer has the sensor wiring layer 55, the second wiring layers 58, and second insulating films 53. The sensor wiring layer 55 and the second wiring layers 58 may extend in parallel to the gate conducting portion 51 and the first wiring layers 56 in the Y-axis direction. In the present example, the second wiring layers 58 extend from one end to the other end of the gate runner 32 in the Y-axis direction. Note that the second wiring layer 58 is electrically connected to the upper-surface electrode 82 and has the same potential as the upper-surface electrode 82.

In contrast, the sensor wiring layer 55 extends from an intermediate point of the gate runner 32 in the extending direction to one end of the gate runner 32 in the Y-axis direction. That is, the length of the sensor wiring layer 55 may be half of the entire length of the gate runner 32. The intermediate point of the gate runner 32 in the extending direction may be approximately the central position of the semiconductor element 30 on the XY plane. In the present example, because the gate runner 32 is spaced away from the rising portion 63, the disconnection of the sensor wiring layer 55 and the second wiring layers 58 can be prevented.

The sensor wiring layer 55 may be used to detect the state of the semiconductor element 30. Approximately at the central position of the semiconductor element 30 on the XY plane, the sensor wiring layer 55 of the present example is used to measure the temperature of the semiconductor element 30. The sensor wiring layer 55 of the present example has a sensor wiring layer 55-A connected to an anode semiconductor region of a diode temperature sensor and a sensor wiring layer 55-K connected to a cathode semiconductor region of the diode temperature sensor.

The second insulating films 53 electrically separate the sensor wiring layer 55-A and the sensor wiring layer 55-K, the second wiring layers 58, and the upper-surface electrode 82 from each other. The second insulating film 53 is a polyimide film, for example. The third layer has the plated layer 38 and a third insulating film 54. Similarly to the second insulating film 53, the third insulating film 54 may also be a polyimide film.

Figure 6:
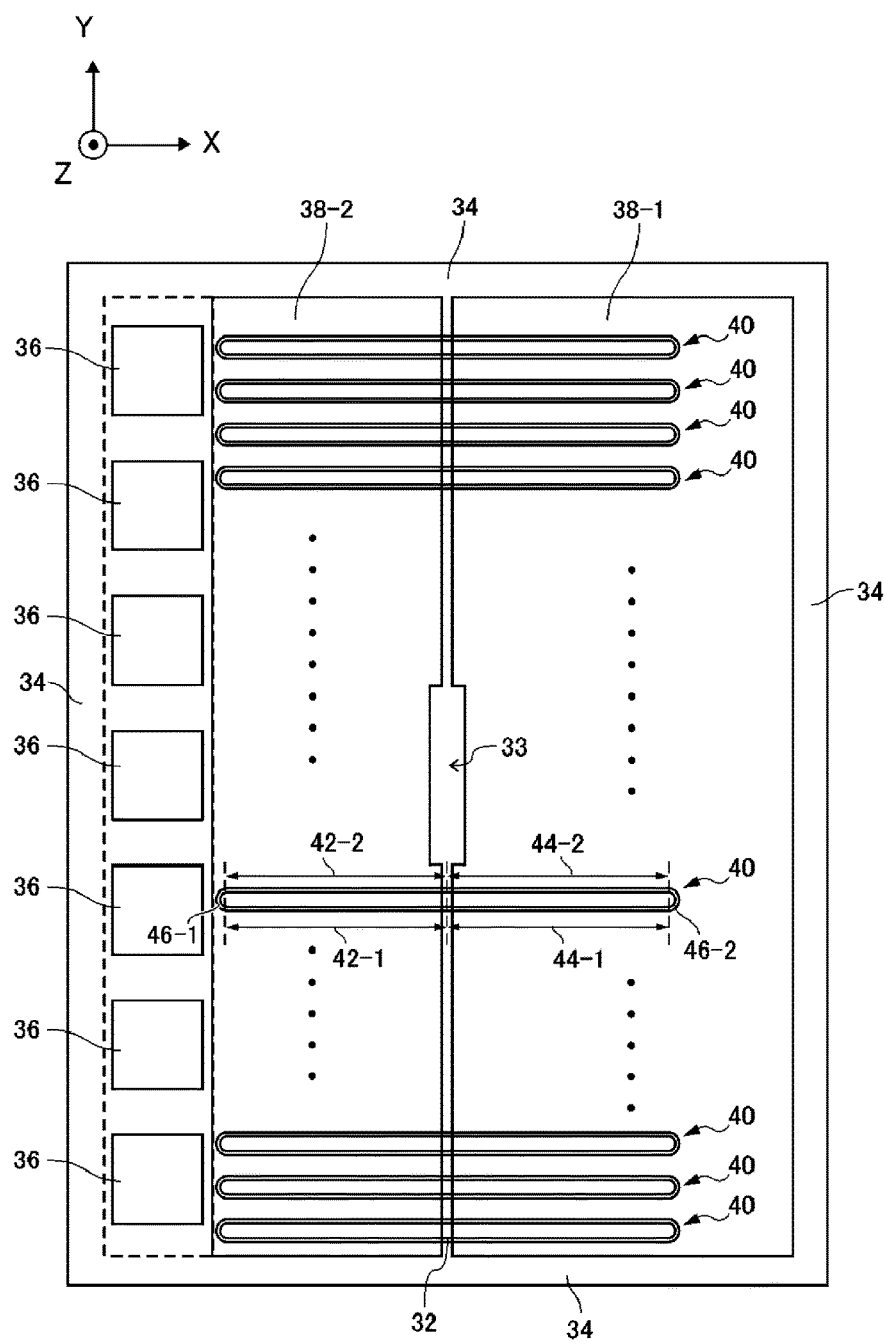
FIG. 6 is a diagram showing gate trench portions 40.

FIG. 6 is a diagram showing gate trench portions 40. FIG. 6 omits description of the metal connecting plate 60 in light of viewability of the drawing. The gate trench portions 40 are provided in the semiconductor element 30. The gate trench portions 40 are electrically connected to the gate conducting portion 51 of the gate runner 32 in FIG. 5. In the plane parallel to the upper surface of the semiconductor element 30, the gate trench portions 40 may extend in a direction orthogonal to the predetermined direction in which the gate runner 32 extends. In the semiconductor element 30 having the rectangular upper surface, by arranging the gate trench portions 40 in parallel to the short sides of the semiconductor element 30 and the gate runner 32 in parallel to the long sides of the semiconductor element 30, a warp of the semiconductor element 30 in the long side direction can be suppressed. In the XY plane, each of the gate trench portions 40 has a length in the extending direction and a width in a direction orthogonal to the extending direction. The lengths and the widths of the respective gate trench portions 40 may be equal to or different from each other. Also, the intervals between the respective gate trench portions 40 may be equal to each other as shown in the drawing or may not be equal to each other.

Furthermore, if the semiconductor element 30 is an RC-IGBT, the semiconductor element 30 may include IGBT regions and FWD regions that each have a stripe shape and are alternately arranged in a direction orthogonal to the longitudinal direction of the stripe shape. The IGBT region may be arranged to include one or more gate trench portions 40. Also, the FWD region may be arranged to include one or more dummy trench portions. Similarly to the gate trench portion 40, the dummy trench portion may have an insulating film and a conducting portion therein. An emitter potential, not a gate potential, may be supplied to the conducting portion of the dummy trench portion. Each of the IGBT region and the FWD region has a width in a direction orthogonal to the extending direction thereof. The widths may be equal to each other or may be different from each other. The number of the gate trench portions 40 provided in the IGBT region may be the same as or different from the number of the dummy trench portions provided in the FWD region. The widths of and the intervals between the gate trench portions 40 arranged in the IGBT region may be the same as or different from the widths of and the intervals between the dummy trench portions arranged in the FWD region.

The gate trench portions 40 of the present example has two parallel lines of equal lengths and two arches, the arches being respectively provided on both ends of the parallel lines. The gate trench portion 40 of the present example has a first extending portion 42 and a second extending portion 44. In the present example, one line of the two parallel lines is configured of the first extending portion 42 and the second extending portion 44. With the gate runner 32 as a start point, the first extending portion 42 and the second extending portion 44 extend in parallel to the direction parallel to the X-axis direction and extend by the same length in directions opposite to each other. By making the first extending portion 42 and the second extending portion 44 have the same lengths, the resistance values in the first extending portion 42 and the second extending portion 44 can be approximately the same. Hence, the amounts of current branching off from the gate conducting portion 51 can be approximately equal.

The boundary between the first extending portion 42 and the second extending portion 44 may be located in a region where in the plane parallel to the upper surface of the semiconductor element 30, the gate runner 32 and the gate trench portion 40 intersect each other. In the region, the gate conducting portion 51 of the gate runner 32 and the gate electrode in the gate trench portion 40 may be electrically connected. However, the first extending portion 42 and the second extending portion 44 are merely convenient portions to illustrate the shape of the gate trench portion 40. The first extending portion 42 and the second extending portion 44 may be provided to be continuous with each other.

Also, the gate trench portion 40 of the present example has a gate connecting portion 46-1 and 46-2 corresponding to the two arches. The first extending portion 42-1 and the first extending portion 42-2 of the present example are connected to the gate connecting portion 46-1 at a position that is an end opposite to the gate runner 32 and is close to the pad 36. Also, the second extending portion 44-1 and the second extending portion 44-2 of the present example are connected to the gate connecting portion 46-2 at a position that is an end opposite to the gate runner 32 and is close to the guard ring 34. In this way, in the plane parallel to the upper surface of the semiconductor element 30, the second extending portions 44-1 and 44-2, and the gate connecting portion 46-2 are provided symmetrically with respect to the first extending portions 42-1 and 42-2, and the gate connecting portion 46-1, with the gate runner 32 as the symmetric axis.

Figure 7:
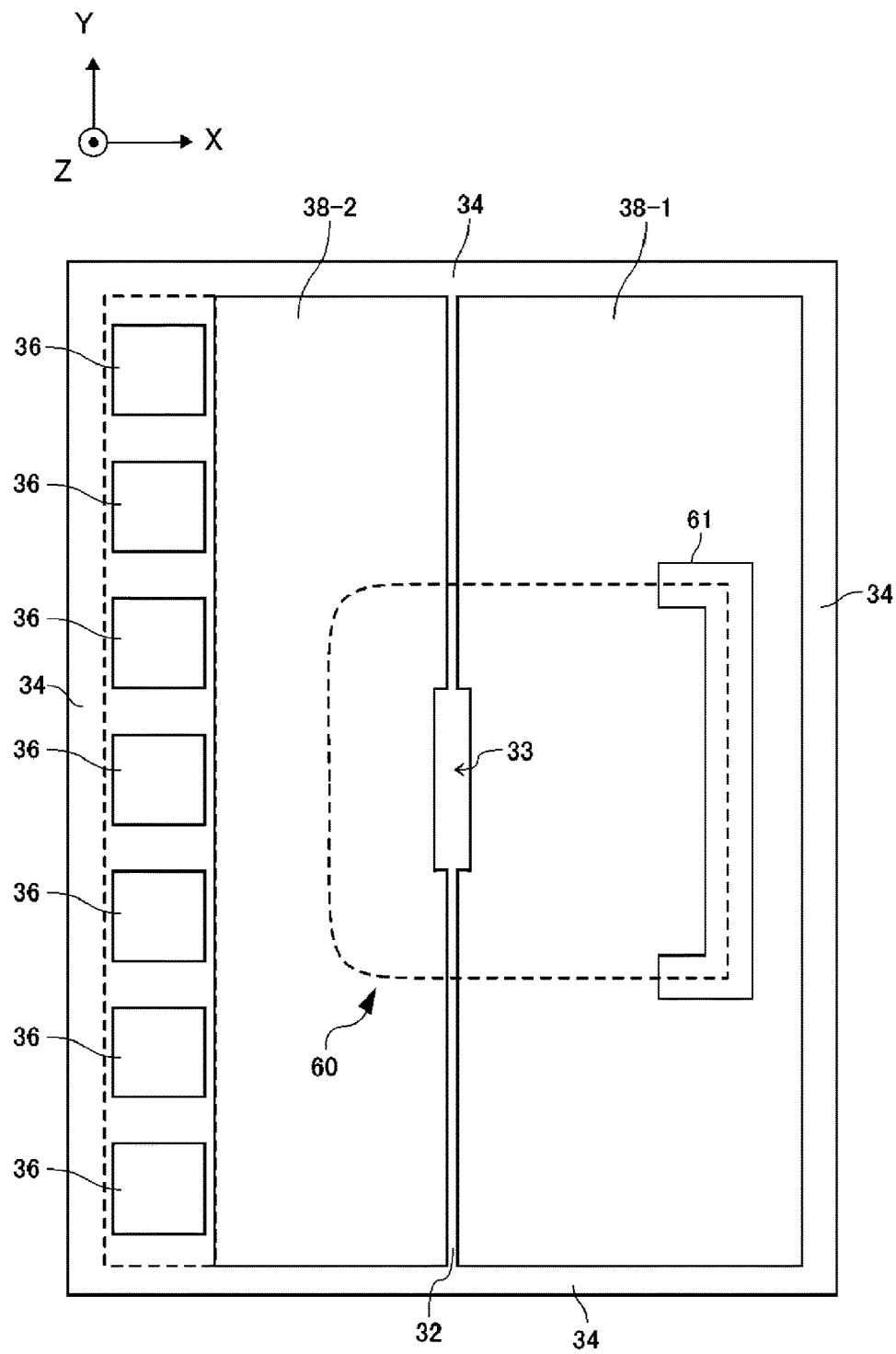
FIG. 7 is a schematic view showing a region 61 in which a large strain is generated by a metal connecting plate 60 in a plane parallel to the upper surface of the semiconductor element 30.

FIG. 7 is a schematic view showing a region 61 in which strain generated by the metal connecting plate 60 is large in the plane parallel to the upper surface of the semiconductor element 30. The region 61 includes a region along the rising portion 63 and a region at the end of the joint portion 62 and in the vicinity of the rising portion 63. In the vicinity of the rising portion 63, stress received from the rising portion 63 increases due to the temperature change, so that the strain becomes larger. As described above, the gate runner 32 and the guard ring 34 are preferably arranged separate from the region 61.

Figure 8:
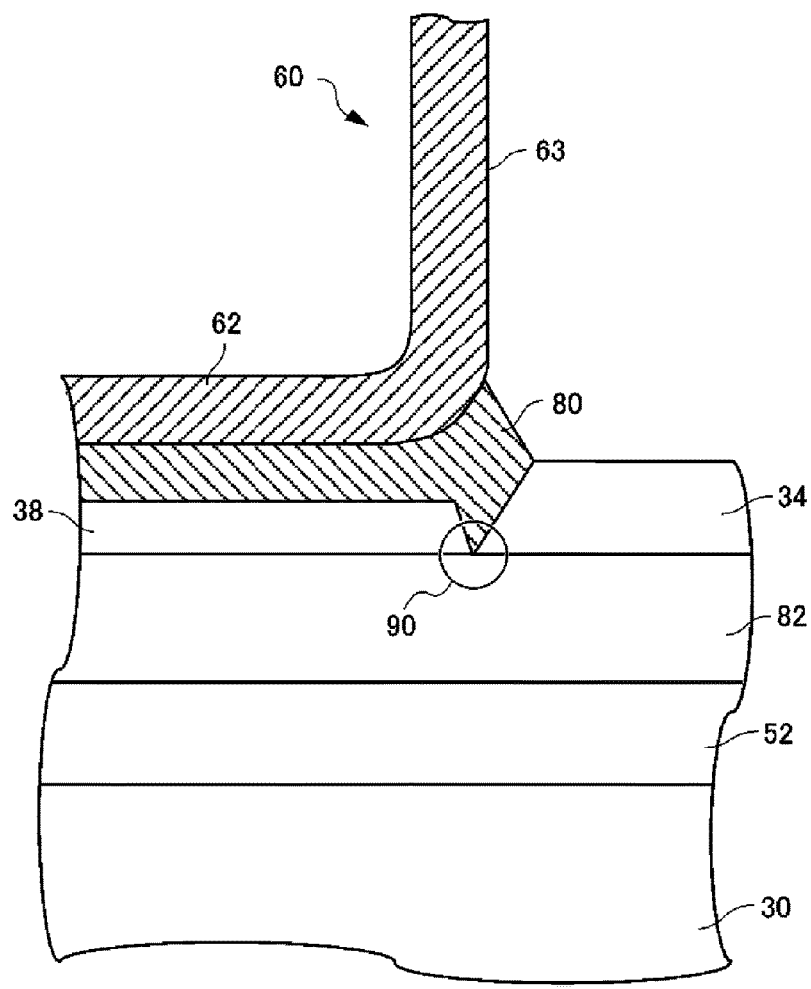
FIG. 8 is a first comparative example illustrating a triple junction 90.

FIG. 8 is a first comparative example illustrating a triple junction 90. The first comparative example shows the triple junction 90 in the vicinity of the guard ring 34. When polyimide or the like in the guard ring 34 contracts, a gap is generated between the guard ring 34 and the plated layer 38.

Then, if the guard ring 34 and the metal connecting plate 60 are too close to each other, the solder portion 80 between the metal connecting plate 60 and the plated layer 38 reaches the triple junction 90 to enter into the gap between the guard ring 34 and the plated layer 38. If the rising portion 63 of the metal connecting plate 60 expands and contracts in the upward and downward direction in this state, stress is applied to the upper surface of the upper-surface electrode 82 via the solder portion 80, thereby generating plastic strain in the upper-surface electrode 82. If the amplitude of the plastic strain in the upward and downward direction becomes too large, the lifetime of the semiconductor device is shortened. In contrast, according to the semiconductor device 100 illustrated in FIG. 1 to FIG. 7, the triple junction 90 and the rising portion 63 are arranged separate from each other. Therefore, the lifetime of the semiconductor device 100 can be prolonged.

Figure 9:
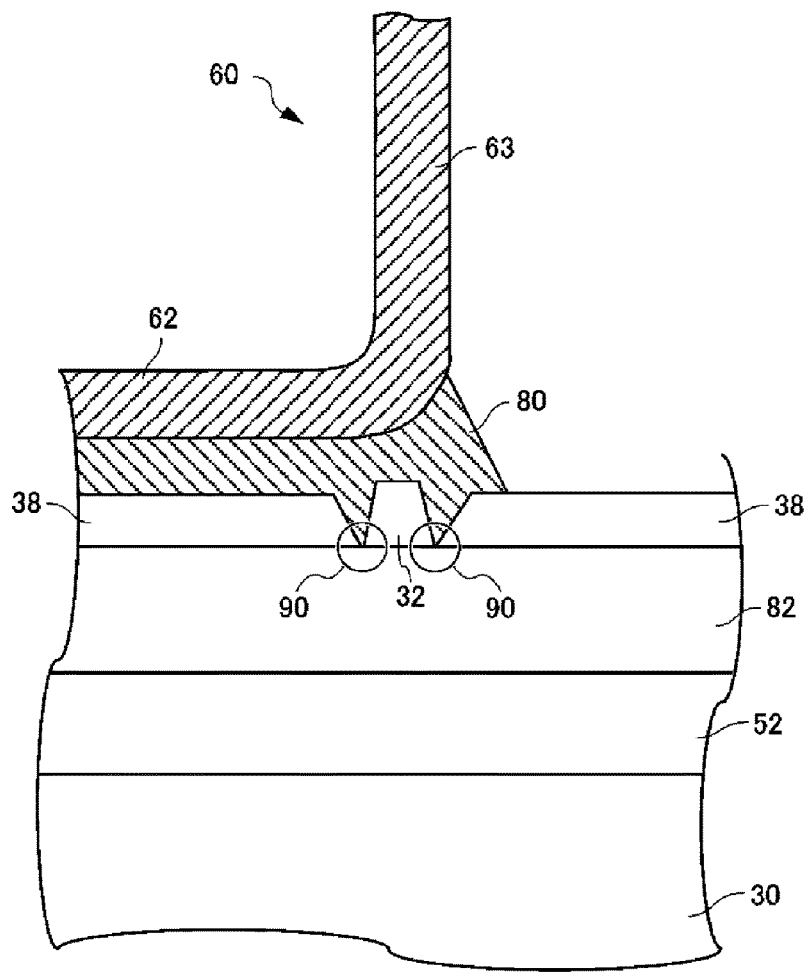
FIG. 9 is a second comparative example illustrating a triple junction 90.

FIG. 9 is a second comparative example illustrating the triple junction 90. The second comparative example shows the triple junction 90 in the vicinity of the gate runner 32. When polyimide or the like in the gate runner 32 contracts, a gap is generated between the gate runner 32 and the plated layer 38.

Then, if the gate runner 32 and the rising portion 63 are too close to each other, stress is applied to the upper surface of the upper-surface electrode 82 via the solder portion 80, thereby generating plastic strain in the upper-surface electrode 82. Similarly to the comparative example in FIG. 8, the lifetime of the semiconductor device is thereby shortened. In contrast, according to the semiconductor device 100 illustrated in FIG. 1 to FIG. 7, because the triple junction 90 and the rising portion 63 are arranged separate from each other, the lifetime of the semiconductor device 100 can be prolonged.

Figure 10:
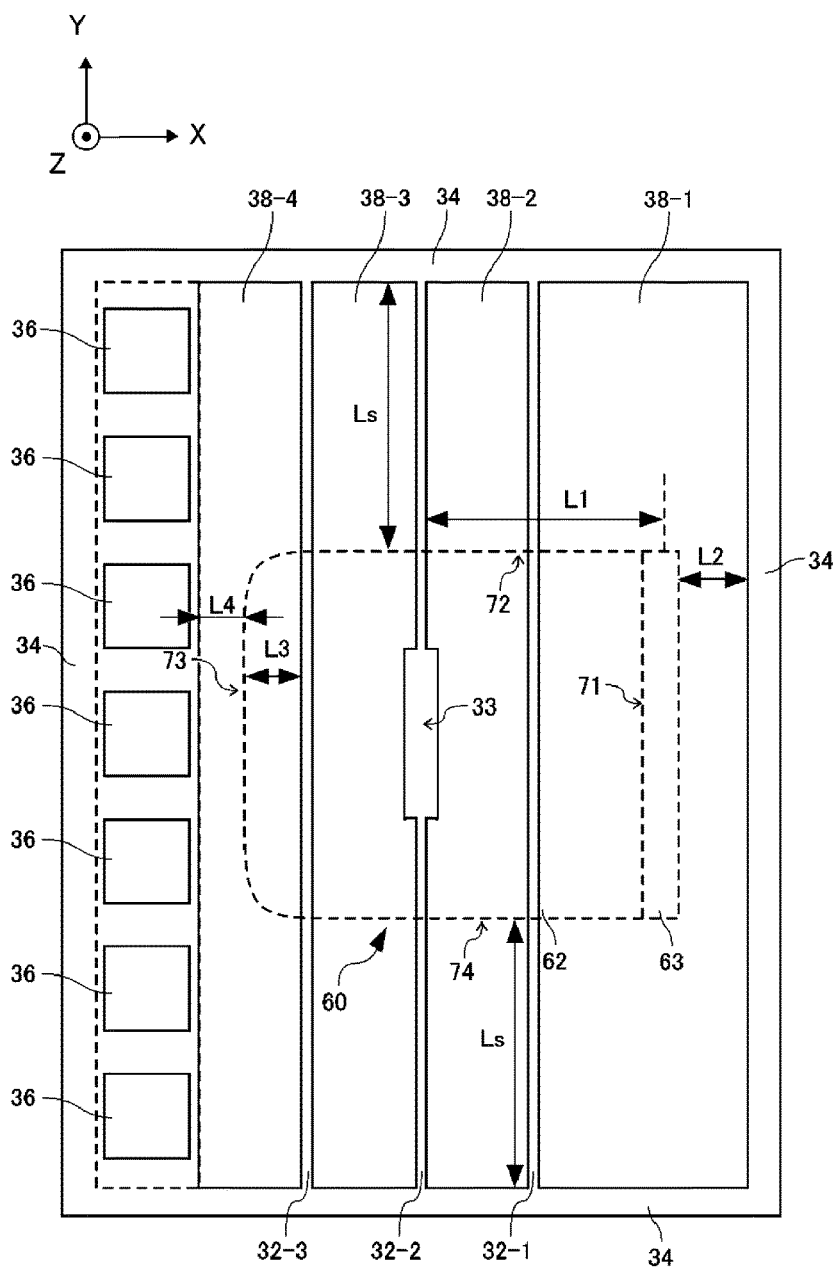
FIG. 10 is a diagram showing an exemplary upper surface of the semiconductor element 30 according to a second embodiment.

FIG. 10 is a diagram showing an exemplary upper surface of the semiconductor element 30 according to a second embodiment. The semiconductor device 100 of the present example has a plurality of gate runners 32 extending in a predetermined direction. In the present example, all of the gate runners 32 extend in a direction parallel to the Y-axis direction. The plated layer 38 is thereby divided into four regions. On the upper surface of the semiconductor element 30, the plated layer 38 of the present example has a plated layer 38-1 in which the rising portion 63 is provided, a plated layer 38-2 that is second close to the rising portion 63, a plated layer 38-3 that is second close to the pads 36, and a plated layer 38-4 that is closest to the pads 36. The joint portion 62 of the metal connecting plate 60 is provided on the plurality of gate runners 32. The present embodiment is different from the first embodiment in this regard.

In the present example, three gate runners 32 are provided. Note that the three gate runners 32 are an example, and two of or four or more of the gate runners 32 may be provided. In the present example, the sense region 33 is provided at the center of the gate runner 32-2 in the extending direction, the gate runner 32-2 being located at the center in a direction parallel to the X-axis direction.

Note that the configuration similar to that of the first embodiment may also be applied to the present example. When exemplified, also in the present example, the rising portion 63 may be provided above the compartment of the plated layer 38-1 that is largest. More specifically, the width of the plated layer 38-1 in the X-axis direction is wider than the widths of the compartments of the other plated layers 38. This can easily secure, in the X-axis direction, the distance between the rising portion 63 and the gate runner 32 and the distance between the rising portion 63 and the guard ring 34. Also, each extending portion 42 of the gate trench portion 40 may extend in the direction parallel to the X-axis direction, similarly to the first embodiment in FIG. 6. The respective extending portions 42 of the gate trench portions 40 may have the same lengths below the plated layer 38-1, 38-2, 38-3, and 38-4.

Figure 11:
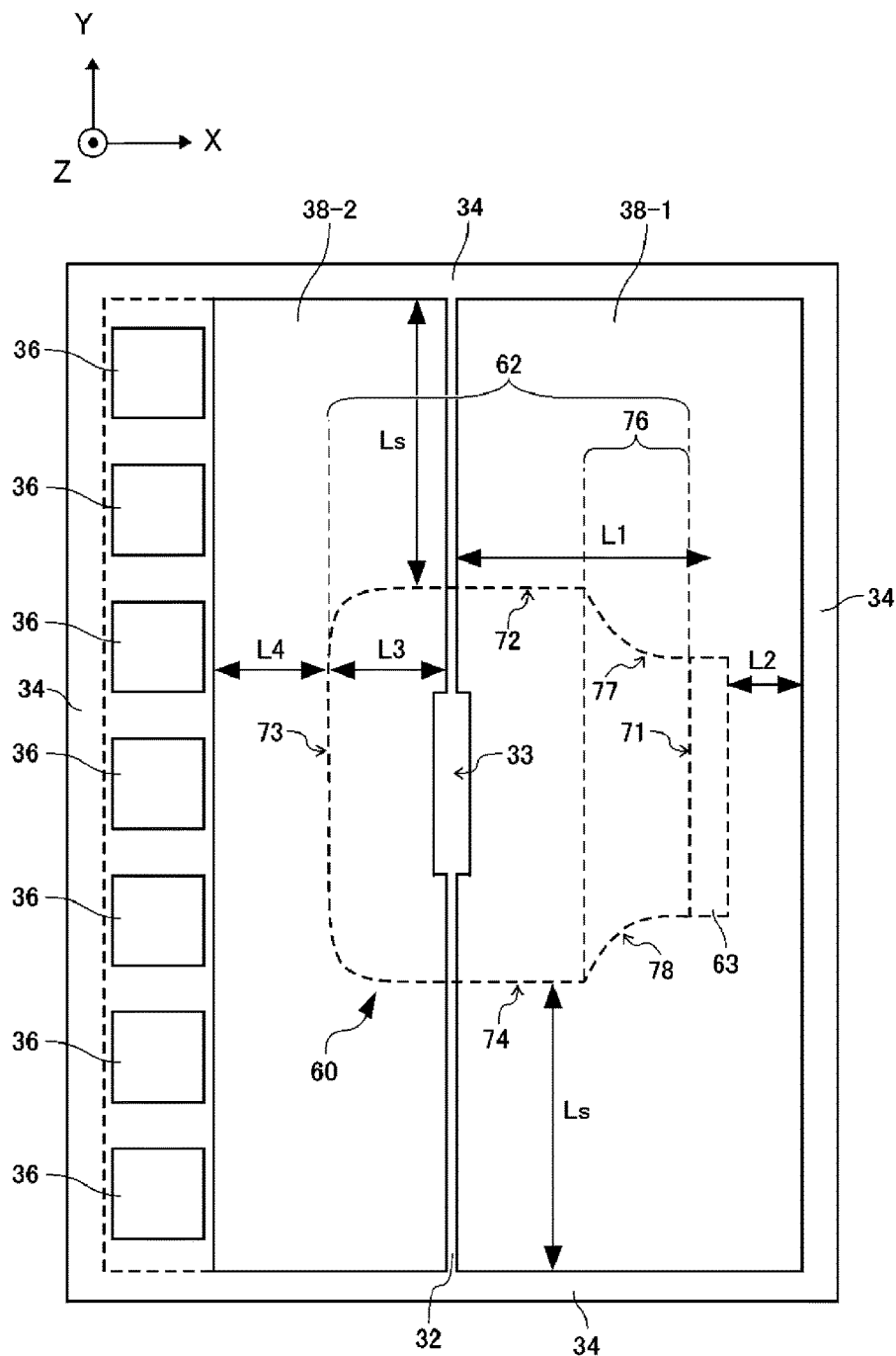
FIG. 11 is a diagram showing an exemplary upper surface of the semiconductor element 30 according to a third embodiment.

FIG. 11 is a diagram showing an exemplary upper surface of the semiconductor element 30 according to a third embodiment. The shape of the joint portion 62 of the present example is different from the shape of the joint portion 62 of the first and second embodiments. The joint portion 62 may have a narrow portion 76 in the range from a predetermined position between the first end 71 and the second end 73 to the first end 71 in the X-axis direction. The narrow portion 76 may be connected to the rising portion 63 at the first end 71 of the joint portion 62. The width of the narrow portion 76 at the first end 71 may be the same as the width of the rising portion 63. Note that the widths of the narrow portion 76 and the rising portion 63 in the present example mean lengths in the direction parallel to the direction from the first side end 72 toward the second side end 74 of the joint portion 62. Also, in the present example, in which the direction from the first side end 72 toward the second side end 74 is parallel to the longitudinal direction of the gate runner 32, the widths of the narrow portion 76 and the rising portion 63 are the respective lengths in the longitudinal direction.

On the plane parallel to the upper surface of the semiconductor element 30, the predetermined position between the first end 71 and the second end 73 may be any position between the first end 71 and the second end 73 in the X-axis direction. However, as the proportion of the narrow portion 76 increases in the joint portion 62, the contact area of the joint portion 62 and the solder portion 80 decreases. Therefore, an upper limit to the area of the narrow portion 76 is preferably provided. In the present example, the narrow portion 76 is provided in the range from the intermediate position between the first end 71 and the second end 73 to the first end 71 in the X-axis direction.

On the plane parallel to the upper surface of the semiconductor element 30, the width of the narrow portion 76 may decrease gradually in the direction from the second end 73 toward the first end 71. In the present example, the distance between a first side end 77 and a second side end 78 of the narrow portion 76 decreases as it approaches the first end 71 from the second end 73. In the present example, although the first side end 77 and the second side end 78 of the narrow portion 76 have a convex curved shape on the inner side thereof, they may have a linear shape or a convex curved shape on the outer side thereof. Because the metal connecting plate 60 of the present example has the narrow portion 76, the distance between the second side end 78 of the narrow portion 76 and the guard ring 34 can be longer than the distance between the second side end 74 of the joint portion 62 and the guard ring 34, the second side end 74 having no narrow portions 76. The triple junction 90 and the rising portion 63 can thereby be as spaced away from each other as possible. Note that it is obvious that the joint portion 62 of the present example may be applied to the second embodiment.

Figure 12:
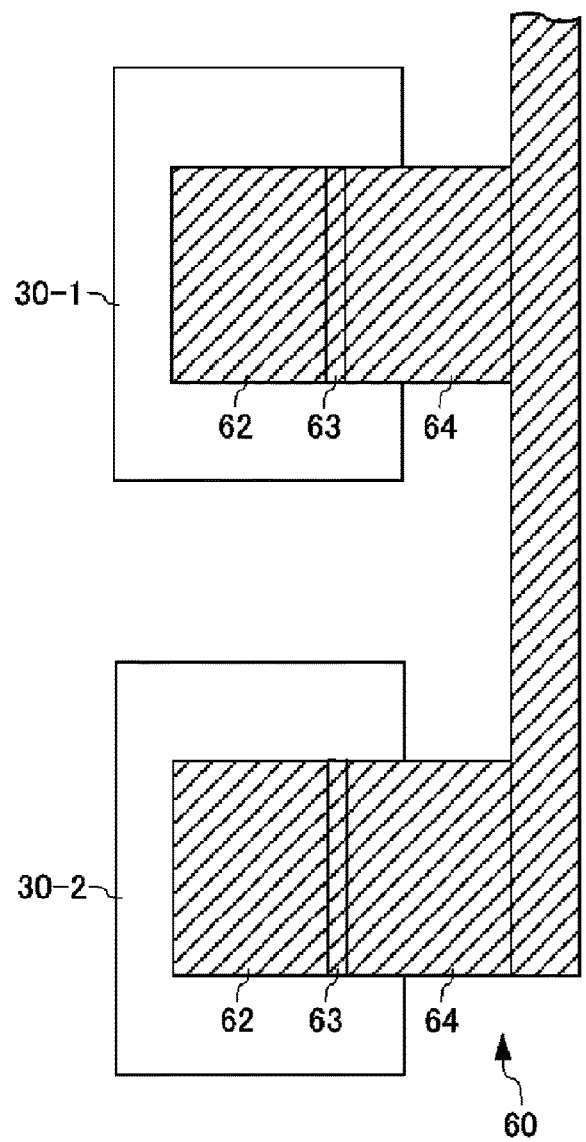
FIG. 12 is a diagram showing an upper surface of a metal connecting plate 60 according to a fourth embodiment.

FIG. 12 is a diagram showing an upper surface of the metal connecting plate 60 according to a fourth embodiment. The metal connecting plate 60 of the present example is connected to a plurality of semiconductor elements 30. For example, the metal connecting plate 60 has the rising portions 63 provided linearly in the plane parallel to the upper surface of the semiconductor element 30 and has a plurality of the joint portions 62 protruding from the rising portions 63. Also in such an example, the distance between the gate runner 32 and the guard ring 34 in each of the rising portions 63 is preferably secured. Note that the relation between the semiconductor element 30, the joint portion 62 and the rising portion 63 in the first and second embodiments may be applied to the present example. Also, the joint portion 62 of the third embodiment may be combined with the present example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMERALS

10: cooling portion; 12: case; 14: solder portion; 16: insulating substrate; 18: circuit portion; 20: circuit portion; 22: sealing resin; 24: solder portion; 25: solder portion; 26: metal plate; 30: semiconductor element; 32: gate runner; 33: sense region; 34: guard ring; 36: pad; 38: plated layer; 40: gate trench portion; 42: first extending portion; 44: second extending portion; 46: gate connecting portion; 51: gate conducting portion; 52: first insulating film; 53: second insulating film; 54: third insulating film; 55: sensor wiring layer; 56: first wiring layer; 57: plug; 58: second wiring layer; 60: metal connecting plate; 61: region; 62: joint portion; 63: rising portion; 64: connection portion; 65: rising portion; 66: joint portion; 67: curved portion; 68: curved portion; 71: first end; 72: first side end; 73: second end; 74: second side end; 76: narrow portion; 77: first side end; 78: second side end; 80: solder portion; 82: upper-surface electrode; 90: triple junction; 100: semiconductor device

What is claimed is:

1. A semiconductor device comprising:
a semiconductor element;
an upper-surface electrode provided on an upper surface of the semiconductor element;
a plated layer provided on an upper surface of the upper-surface electrode;
one or more gate runners that penetrate the plated layer and are provided to extend in a predetermined direction on the upper surface of the semiconductor element; and
a metal connecting plate that is arranged above the plated layer and is electrically connected to the upper-surface electrode, wherein
the metal connecting plate has
a joint portion parallel to the upper surface of the semiconductor element; and
a rising portion that is connected to a first end of the joint portion and extends in a direction away from the upper surface of the semiconductor element, and
in a plane parallel to the upper surface of the semiconductor element, the rising portion and the gate runner do not overlap with each other.

2. The semiconductor device according to claim 1, wherein all of the one or more gate runners extend in the predetermined direction.

3. The semiconductor device according to claim 1, wherein at least one of the one or more gate runners has a sensor wiring layer that is electrically separated from a gate conducting portion and the upper-surface electrode which are provided on the semiconductor element and is used to detect a state of the semiconductor element.

4. The semiconductor device according to claim 1, wherein the semiconductor element has a gate trench portion electrically connected to the one or more gate runners, and
in the plane parallel to the upper surface of the semiconductor element, the gate trench portion extends in a direction orthogonal to the predetermined direction in which the one or more gate runners extend.

5. The semiconductor device according to claim 4, wherein the gate trench portion has a first extending portion and a second extending portion that extend in parallel to the orthogonal direction and by the same length in directions opposite to each other, with one of the one or more gate runners as a start point.

6. The semiconductor device according to claim 1, further comprising, in a plane parallel to the upper surface of the upper-surface electrode, a guard ring provided outside the plated layer, wherein
in the plane parallel to the upper surface of the semiconductor element, a shortest distance between the guard ring and a side end of the joint portion is 1 mm or longer.

7. The semiconductor device according to claim 6, further comprising a solder portion provided between the metal connecting plate and the plated layer, wherein
the solder portion does not contact the guard ring.

8. The semiconductor device according to claim 1, wherein on the plane parallel to the upper surface of the semiconductor element, the joint portion has a narrow portion a width of which decreases gradually in a direction from a second end facing the first end toward the first end,
the rising portion is connected to the narrow portion at the first end of the joint portion, and
a width of the rising portion is the same as a width of the narrow portion at the first end.

9. The semiconductor device according to claim 1, wherein a curved portion having a radius of curvature of 1 mm or longer is provided at a boundary portion between the rising portion and the joint portion.

10. The semiconductor device according to claim 1, wherein in the plane parallel to the upper surface of the semiconductor element, a shortest distance between a second end opposite to the first end of the joint portion and the gate runner that does not overlap with the second end is 1 mm or longer.

11. The semiconductor device according to claim 1, wherein in the plane parallel to the upper surface of the semiconductor element, the plated layer is divided into a plurality of compartments by the gate runner, and
the rising portion is provided above a largest compartment of the compartments of the plated layer.

12. The semiconductor device according to claim 1, wherein in the plane parallel to the upper surface of the semiconductor element, the rising portion is arranged along a longitudinal direction of the semiconductor element.

13. The semiconductor device according to claim 1, further comprising a gate pad arranged on the upper surface of the semiconductor element, wherein
the gate pad is provided outside a second end opposite to the first end of the joint portion.

* * * * *